(12) United States Patent
Kanno

(10) Patent No.: US 7,633,395 B2
(45) Date of Patent: Dec. 15, 2009

(54) RADIO FREQUENCY IDENTIFICATION TAG AND COMMODITY

(75) Inventor: Masayoshi Kanno, Kanagawa (JP)

(73) Assignee: Sony Corporation, Tokyo (JP)

( * ) Notice: Subject to any disclaimer, the term of this patent is extended or adjusted under 35 U.S.C. 154(b) by 371 days.

(21) Appl. No.: 11/809,246

(22) Filed: May 31, 2007

(65) Prior Publication Data

US 2007/0296555 A1 Dec. 27, 2007

(30) Foreign Application Priority Data

Jun. 15, 2006 (JP) .............................. 2006-166130

(51) Int. Cl.
*G08B 13/14* (2006.01)
(52) U.S. Cl. .................. 340/572.7; 340/572.8
(58) Field of Classification Search .............. 340/572.1, 340/572.4, 572.7, 572.8, 5.61, 5.66, 10.1, 340/10.2, 10.3; 235/380, 403; 361/5; 336/200
See application file for complete search history.

(56) References Cited

U.S. PATENT DOCUMENTS

| | | | | |
|---|---|---|---|---|
| 6,392,524 B1 * | 5/2002 | Biegelsen et al. | ........... | 336/200 |
| 7,190,561 B2 * | 3/2007 | Pellon et al. | ................... | 361/5 |
| 7,190,562 B2 * | 3/2007 | Pellon et al. | ................... | 361/5 |
| 7,535,364 B2 * | 5/2009 | Sakama et al. | ........... | 340/572.7 |
| 2007/0069397 A1 * | 3/2007 | Van Lerberghe et al. | .... | 257/784 |

FOREIGN PATENT DOCUMENTS

JP 2005-064822 3/2005

* cited by examiner

*Primary Examiner*—Van T. Trieu
(74) *Attorney, Agent, or Firm*—Robert J. Depke; Rockey, Depke & Lyons, LLC

(57) ABSTRACT

A radio frequency identification tag including a substrate, an antenna provided at the substrate, the antenna formed by winding a conductor in a coil pattern around, and on a plane orthogonal to, a center axis of the substrate, the center axis extending in a direction parallel to the thickness direction of the substrate, a radio frequency identification chip attached to the substrate and operative to perform radio communication with a reader/writer apparatus through the antenna, and a package sealing the substrate and the antenna as well as the radio frequency identification chip therein, wherein a mark for specifying the center axis is formed on an outside surface where the package is exposed to the outside.

27 Claims, 12 Drawing Sheets

RADIO FREQUENCY IDENTIFICATION TAG AND COMMODITY

CROSS REFERENCES TO RELATED APPLICATIONS

The present invention contains subject matter related to Japanese Patent Application JP 2006-166130 filed in the Japan Patent Office on Jun. 15, 2006, the entire contents of which being incorporated herein by reference.

BACKGROUND OF THE INVENTION

1. Field of the Invention

The present invention x relates to a Radio Frequency IDentification tag (hereinafter referred to as RFID tag) and a commodity provided with the RFID tag.

2. Description of the Related Art

From the viewpoints of higher efficiencies of physical distribution and management and the traceability of products, in recent years, RFID tags formed to be of the IC type have come to be utilized (See Japanese Patent Laid-open No. 2005-64822 herein after referred to as Patent Document 1).

The RFID tag has the merits that non-contact reading can be achieved therewith by use of a reader/writer apparatus and that the amount of information stored therein is larger than that in the bar code. In addition, the RFID tags include a variety of types, such as the micromiature type and the rewritable type, and they can spread out according to the intended uses

SUMMARY OF THE INVENTION

However, attachment of an RFID tag to a commodity is generally conducted mainly by processing the RFID tag to obtain an RFID tag sheet and adhering or applying the RFID tag to the commodity, which takes a number of steps and considerable cost. Besides, the RFID tags have many problems with respect to durability and security, such as the generation of defectives due to breakage, deterioration or the like and the measure needed to prevent malpractice, e.g., misappropriation thereof.

In view of these problems, it may be contemplated to provide an RFID tag in the inside of a case constituting the armor of a commodity, instead of applying the RFID tag to the surface of the commodity. Specifically, in the case where the case constituting the armor of a commodity is composed of a molding of a synthetic resin, it may be contemplated to embed the RFID tag in the molding or to attach the RFID tag to the inside surface of the case, in the process of molding.

Meanwhile, when the positions of an antenna possessed by the RFID tag and an antenna of the reader/writer apparatus are deviated from the desired positions or when the distance between the antennas exceeds the maximum traffic distance, it become difficult to achieve favorable radiocommunication between the RFID tag and the reader/writer apparatus. Therefore, there is a demand for accurate and easy distinguishing of the position of the antenna of the RFID tag.

In view of this, in providing a commodity with an RFID tag, it may be necessary to accurately position the antenna of the RFID tag, and it is desirable that the position of the antenna of the RFID tag attached to the case can be easily distinguished.

Thus, there is a need for an RFID tag which can be easily provided at a desired portion of a case of a commodity and in a desired orientation.

There is also a need for providing a commodity which is advantageous for favorable communication with a reader/writer apparatus, by providing the commodity with the just-mentioned RFID tag.

According to one embodiment of the present invention, there is provided an RFID tag including, a substrate, an antenna provided at the substrate, the antenna formed by winding a conductor in a coil pattern around, and on a plane orthogonal to, a center axis of the substrate, the center axis extending in a direction parallel to the thickness direction of the substrate, an RFID chip attached to the substrate and operative to perform radiocommunication with a reader/writer apparatus through the antenna, and a package sealing the substrate and the antenna as well as the RFID chip therein, wherein a mark for specifying the center axis is formed on an outside surface where the package is exposed to the outside.

According to another embodiment of the present invention, there is provided an RFID tag including, a substrate, an antenna provided at the substrate, the antenna formed by winding a conductor in a coil pattern around, and on a plane orthogonal to, a center axis of the substrate, the center axis extending in a direction parallel to the thickness direction of the substrate, an RFID chip attached to the substrate and operative to perform radiocommunication with a reader/writer apparatus through the antenna, and a package sealing the substrate and the antenna as well as the RFID chip therein, wherein the package has a height along the thickness direction of the substrate, the package has a first surface and a second surface located respectively at both ends in the height direction thereof, the antenna is located nearer to either one of the first surface and the second surface, the either one of the first surface and the second surface to which the antenna is located nearer is made to be an antenna plane, and a mark for specifying the antenna plane is formed on an outside surface where the package is exposed to the outside.

According to a further embodiment of the present invention, there is provided a commodity having a case provided with an RFID tag, the RFID tag including, a substrate, an antenna provided at the substrate, the antenna formed by winding a conductor in a coil pattern around, and on a plane orthogonal to, a center axis of the substrate, the center axis extending in a direction parallel to the thickness direction of the substrate, an RFID chip attached to the substrate and operative to perform radiocommunication with a reader/writer apparatus through the antenna, and a package sealing the substrate and the antenna as well as the RFID chip therein, wherein a mark for specifying the center axis is formed on an outside surface where the package is exposed to the outside, and the RFID tag is provided in the inside of the case in such a state that its location in the inside of the case and its orientation in the inside of the case are determined with reference to the mark.

According to yet another embodiment of the present invention, there is provided a commodity having a case provided with an RFID tag, the RFID tag including, a substrate, an antenna provided at the substrate, the antenna formed by winding a conductor in a coil pattern around, and on a plane orthogonal to, a center axis of the substrate, the center axis extending in a direction parallel to the thickness direction of the substrate, an RFID chip attached to the substrate and operative to perform radiocommunication with a reader/writer apparatus through the antenna, and a package sealing the substrate and the antenna as well as the RFID chip therein, wherein the package has a height along the thickness direction of the substrate, the package has a first surface and a second surface located respectively at both ends in the height direction, the antenna is located nearer to either one of the first surface and the second surface, the either one of the first surface and the second surface to which the antenna is located nearer is made to be an antenna plane, a mark for specifying the antenna plane is formed on an outside surface where the package is exposed to the outside, and the RFID tag is provided in the inside of the case in such a state that its location in the inside of the case and its orientation in the inside of the case are determined with reference to the mark.

According to the RFID tag based on the one embodiment of the present invention, the mark for specifying the center axis of the antenna is formed on the outside surface where the package of the RFID tag is exposed to the outside, and, therefore, the RFID tag can be easily provided at a desired portion in the inside of the case of a commodity and in a desired orientation.

In addition, according to the RFID tag based on the another embodiment of the present invention, the mark for specifying the antenna plane is formed on the outside surface where the package of the RFID tag is exposed to the outside, and, therefore, the RFID tag can be easily provided at a desired portion in the inside of the case of a commodity and in a desired orientation.

Besides, according to the commodity based on the further embodiment of the present invention, an RFID tag as above-mentioned is provided in the inside of a case of the commodity, whereby the center axis of the antenna of a reader/writer apparatus can be made to coincide with or be located in the vicinity of the center axis of the antenna of the RFID tag, which is advantageous for performing favorable communication.

Further, according to the commodity based on the yet another embodiment of the present invention, an RFID tag as above-mentioned is provided in the inside of a case of the commodity, whereby the antenna plane can be located in the state of being directed toward the outside surface of the case, which is advantageous for performing favorable communication.

DETAILED DESCRIPTION OF THE PREFERRED EMBODIMENTS

First Embodiment

Figure 1A:
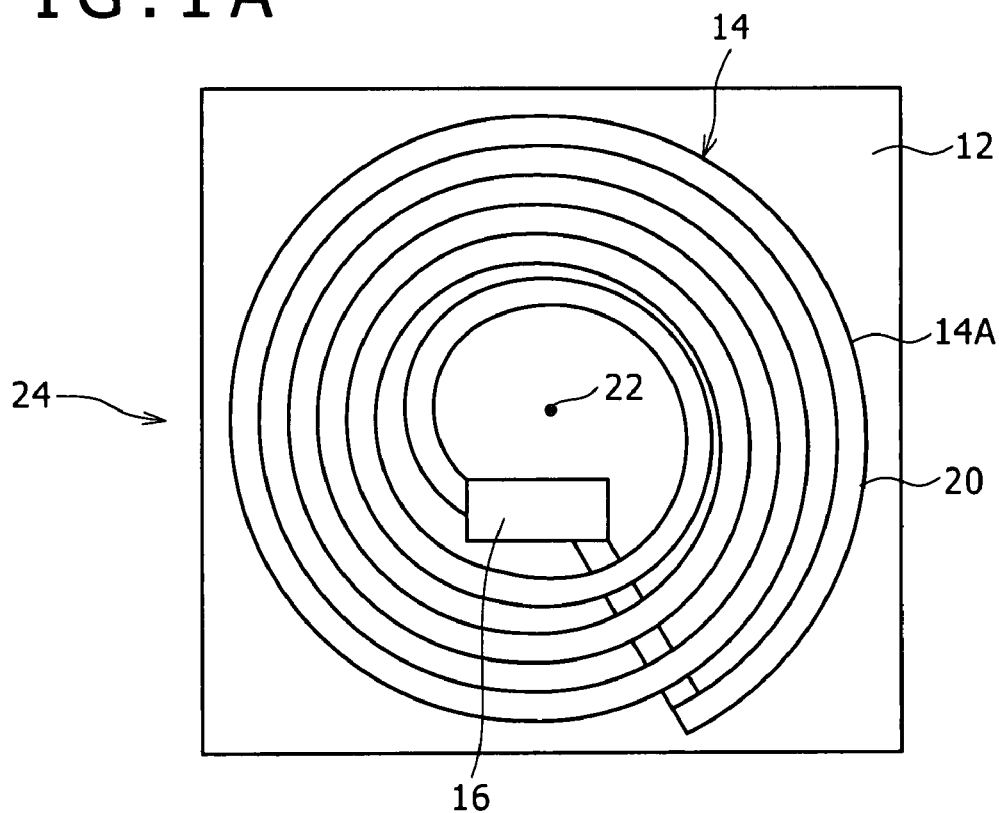
FIG. 1A is a plan view of only a substrate constituting a general RFID tag.

Now, an embodiment of the present invention will be described below referring to the drawings.

Before describing the embodiment, the configuration of a general RFID tag 10 will be described.

Figure 1B:
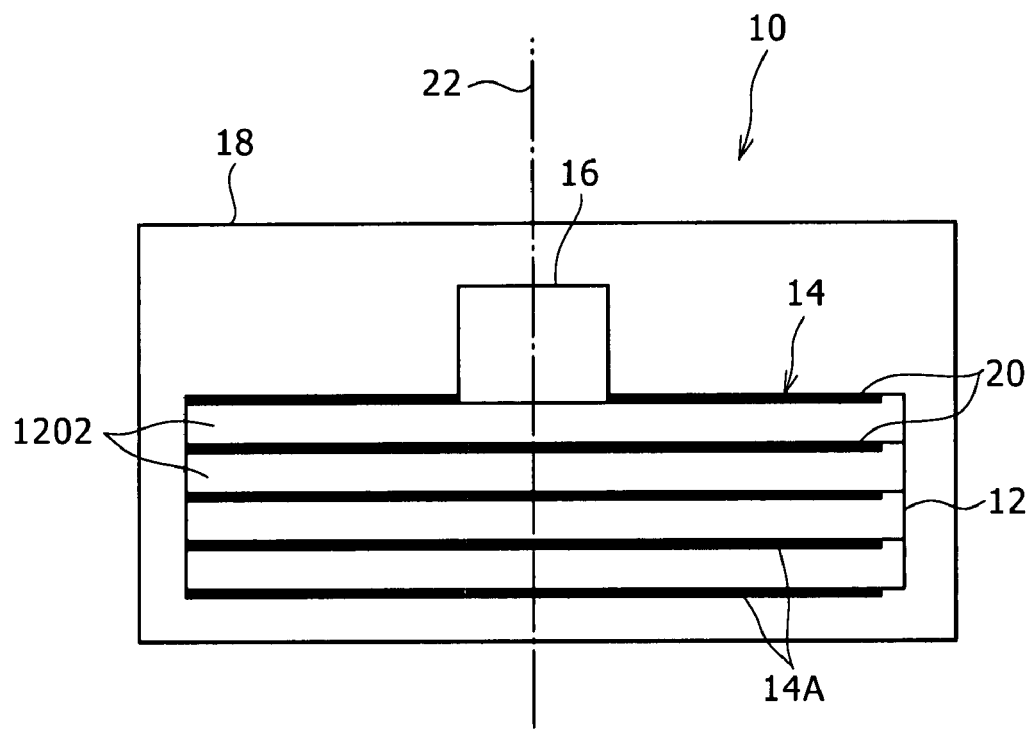
FIG. 1B is a sectional view of the RFID tag with the substrate incorporated therein.
Figure 2:
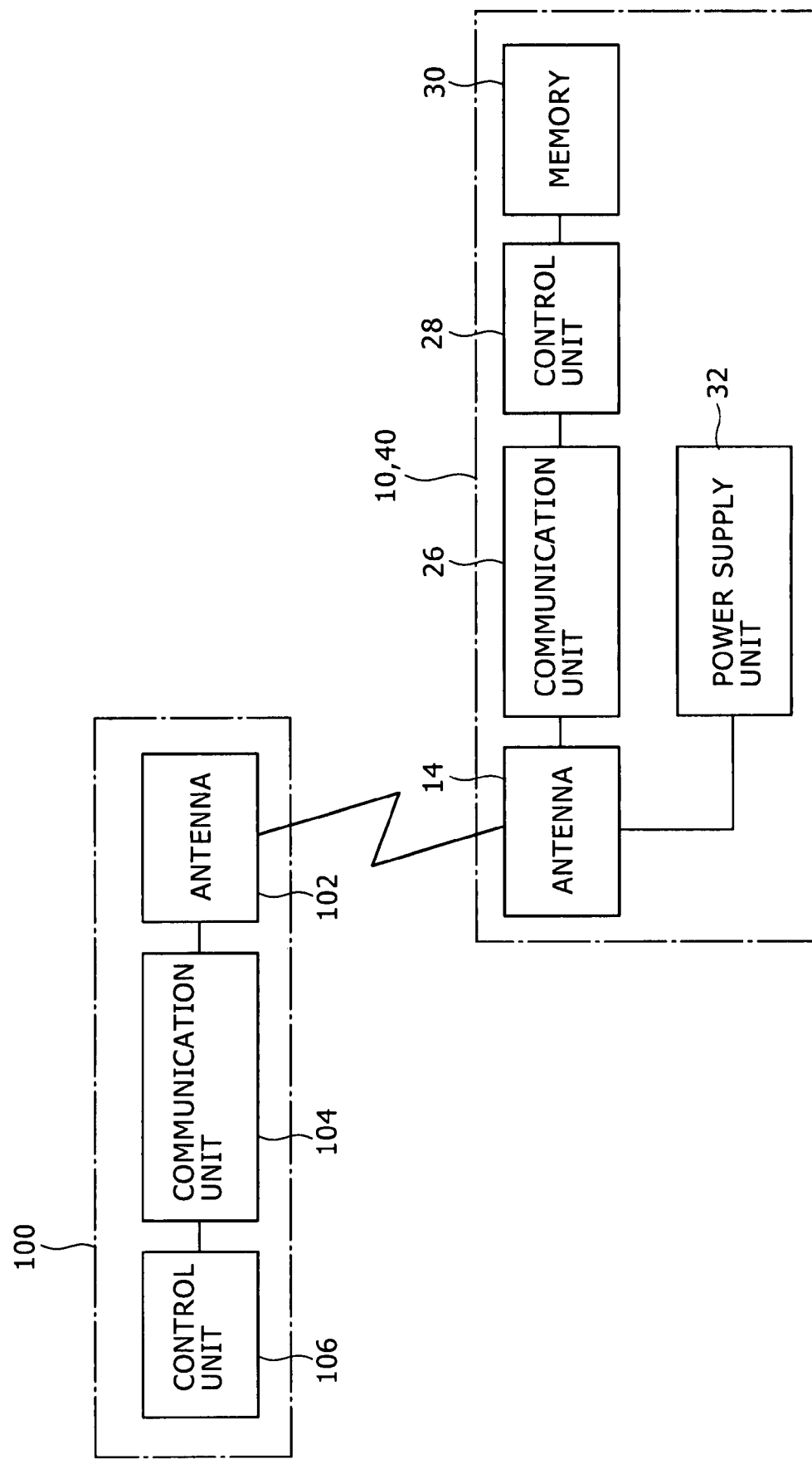
FIG. 2 is a block diagram showing the configuration of an RFID tag and a reader/writer apparatus.

FIG. 1A is a plan view of only a substrate 12 constituting a general RFID tag 10, FIG. 1B is a sectional view of the RFID tag 10 with the substrate 12 incorporated therein, and FIG. 2 is a block diagram showing the configuration of the RFID tag 10 and a reader/writer apparatus 100.

As shown in FIGS. 1A and 1B, the RFID tag 10 includes the substrate 12, an antenna 14, an RFID chip 16, and a package 18.

The substrate 12 is a laminate substrate in which a plurality of insulating layers 1202 and a plurality of antenna pieces 14A are alternately stacked.

The antenna 14 includes the plurality of antenna pieces 14A, and each of the antenna pieces 14A is configured by forming a conductive layer in a coil pattern on the insulating layer 1202.

More specifically, each antenna piece 14A is formed by winding a conductor 20, constituting the conductive layer, in the coil pattern around, and on a plane orthogonal to, the center axis 22 of the substrate 12 which axis extends in a direction parallel to the thickness direction of the substrate 12.

The RFID chip 16 is attached to the substrate 12 and operative to perform radiocommunication with the reader/writer apparatus 100 through the antenna 14.

The assembly in which the RFID chip 16 is attached to the substrate 12 provided with the antenna 14 is referred to as an inlet 24.

The package 18 seals the substrate 12 and the antenna 14 as well as the RFID chip 16. As the material of the package 18, thermosetting resins commonly used as a package material for ICs and LSIs, for example, epoxy resin, can be used.

As shown in FIG. 2, on a functional basis, the RFID tag 10 includes in addition to the antenna 14, a communication unit 26, a control unit 28, a memory 30, and a power supply unit 32. The communication unit 26, the control unit 28, the memory 30, and the power supply unit 32 are provided in the RFID chip 16.

The communication unit 26 is operative to perform radiocommunication with the reader/writer apparatus 100 through the antenna 14, and includes a modulation circuit for modulating a transmitted signal, a demodulation circuit for demodulating a received signal, and the like.

The control unit 28 includes a CPU or the like, and controls the communication unit 26 and the memory 30.

The memory 30 is a component for storing data, and reading and writing of data in the memory 30 are conducted by the control unit 28.

The power supply unit 32 is a component for generating electric power based on an electromagnetic wave transmitted from the reader/writer apparatus 100, and supplies the electric power to the communication unit 26, the control unit 28, and the memory 30 to thereby permit them to operate.

The reader/writer apparatus 100 includes an antenna 102, a communication unit 104, a control unit 106 and the like.

The antenna 102 is a component for transmission and reception of electromagnetic waves between itself and the antenna 14 of the RFID tag 10.

The communication unit 104 is a component for communication with the RFID tag 10 through the antenna 102.

The control unit 106 is a component for producing data to be transmitted to the RFID tag 10, supplying the data to the communication unit 104, receiving from the communication unit 104 the data received from the RFID tag 10, and treating the data received from the communication unit 104.

Now, a first embodiment of the present invention will be described below.

Figure 3A:
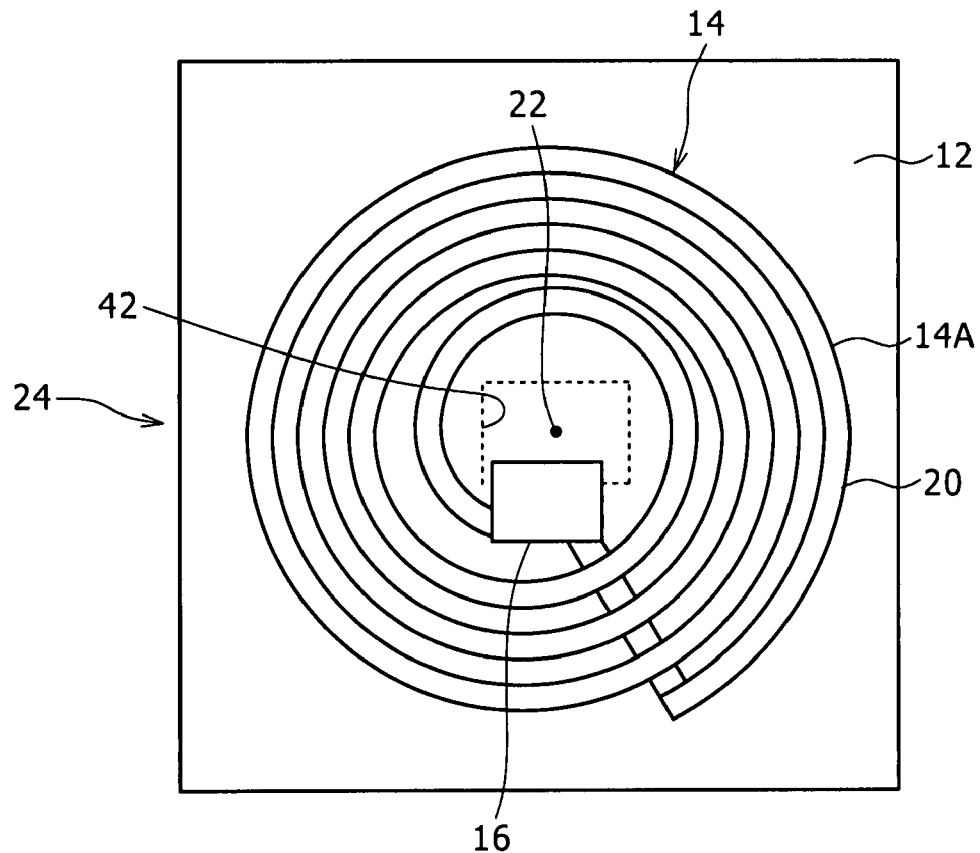
FIG. 3A is a plan view of only a substrate constituting an RFID tag according to a first embodiment.
Figure 3B:
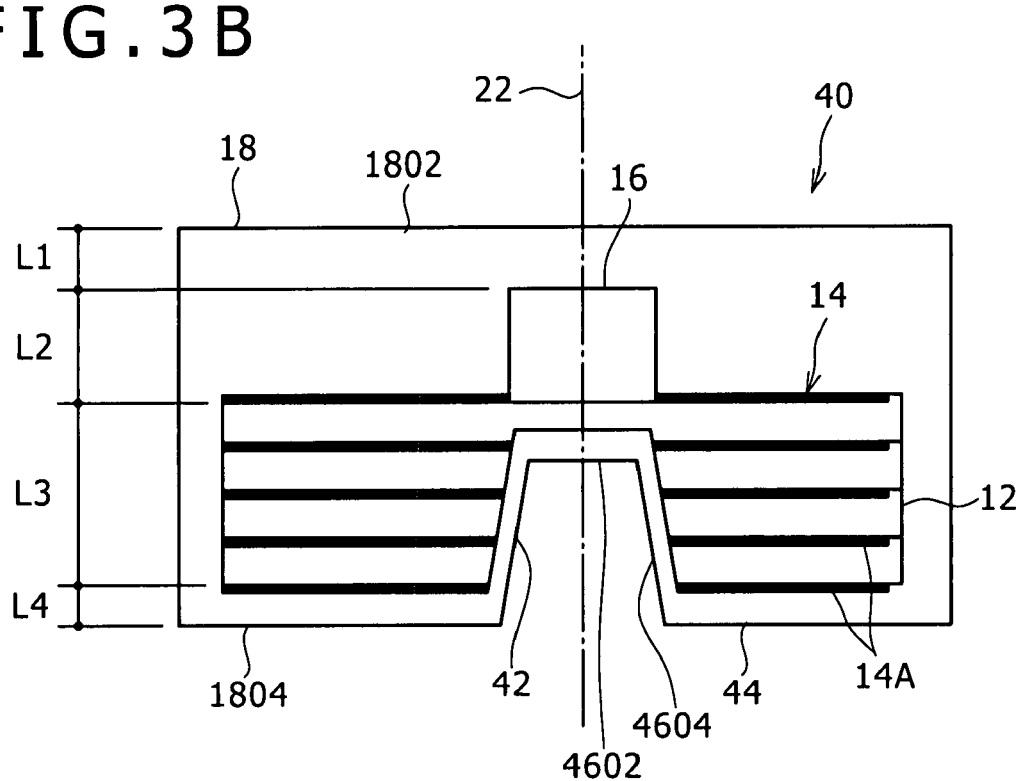
FIG. 3B is a sectional view of the RFID tag with the substrate incorporated therein.

FIG. 3A is a plan view of only a substrate 12 constituting an RFID tag 40 according to the first embodiment, and FIG. 3B is a sectional view of the RFID tag 40 with the substrate 12 incorporated therein.

Incidentally, in the following description, the same parts and members as those in FIGS. 1 and/or 2 will be denoted by the same symbols as used above.

The RFID tag 40 according to the first embodiment includes the substrate 12, an antenna 14, an RFID chip 16, a package 18, and a mark 42.

The RFID tag 40 is of the passive type, like the RFID tag 10 above-mentioned, and is not required to have a power supply, therefore, the RFID tag 40 by itself has all the functions of an RFID tag.

The substrate 12 includes a laminate substrate having a plurality of insulating layers 1202 and a plurality of antenna pieces 14A stacked alternately.

The antenna 14 includes the plurality of antenna pieces 14A. Each of the antenna pieces 14A is configured by forming a conductive layer in a coil pattern on the insulating layer 1202, specifically, a conductor 20 constituting the conductive layer is wound in a coil pattern around, and on a plane orthogonal to, the center axis 22 of the substrate 20 which extends in a direction parallel to the thickness direction of the substrate 12. The antenna pieces 14A are connected to each other through via holes for connection between the conductive layers.

In this embodiment, as shown in FIG. 3B, each of the antenna pieces 14A is not disposed in the vicinity of the center axis 22 but is wound in a coil pattern in the surroundings of the vicinity of the center axis 22.

The RFID chip 16 is attached to the substrate 12 and operative to perform radiocommunication with a reader/writer apparatus 100 through the antenna 14.

The package 18 seals the substrate 12 and the antenna 14 as well as the RFID chip 16 therein.

In this embodiment, the RFID tag 40 uses a radiocommunication band of 13.56 MHz, and the maximum traffic distance for communication with the reader/writer apparatus 100 is comparatively short, hence, the RFID tag 40 is of the system which is called proximity type or vicinity type. The embodiment of the present invention, however, naturally is not limited to the above-mentioned band.

In this embodiment, the package 18 is formed in a rectangular plate-like shape having a height along the thickness direction of the substrate 12.

The package 18 has a flat first surface 1802 and a flat second surface 1804 which are located respectively at both ends in the height direction and are parallel to each other.

The substrate 12 is embedded in the inside of the package 18 at a position nearer to the second surface 1804 (than to the first surface 1802) and, therefore, the antenna 14 also is located nearer to the second surface 1804.

Here, the second surface 1804 to which the antenna 14 is located nearer is referred to as the antenna plane 44.

The RFID chip 16 is mounted on a surface, fronting on the first surface 1802, of the substrate 12, is connected to the antenna 14 by wire bonding or the like, and is sealed with an epoxy resin or the like. While the RFID chip 16 is disposed at a position, in the vicinity of the center axis 22, of the surface of the substrate 12 in this embodiment, it may be disposed at a position spaced away from the vicinity of the center axis 22.

The mark 42 is for specifying where in the RFID tag 10 the center axis 22 is located, and for specifying where the antenna plane 44 is located. The mark 42 is formed on an outside surface where the package 18 is exposed to the outside.

In this embodiment, the mark 42 has a recess 46 provided as a center axis and antenna plane specifying shape being located at a position in the vicinity of the center axis 22 (where none of the antenna pieces 14A is located) and extending along the center axis 22.

The recess 46 opens in the antenna plane 44, and has a depth toward the other one of the first surface 1802 and the second surface 1804. In this embodiment, therefore, the location where the recess 46 is provided is the antenna plane 44.

A bottom surface 4602 of the recess 46 is located in the inside of the substrate, and side surfaces 4604 and the bottom surface 4602 of the recess 46 are formed by the package.

The sectional shape of the recess 46 in a plane orthogonal to the depth direction of the recess 46 is rectangular.

The sectional shape of the recess 46 in a plane orthogonal to the depth direction of the recess 46 is gradually decreased in size as the bottom surface 4602 of the recess 46 is approached.

The center of the section of the recess 46 in a plane orthogonal to the depth direction of the recess 46 coincides with the center axis 22.

Incidentally, in FIG. 3B, exemplary dimensions of the parts of the RFID tag 40 are as follows. For example, the length of one edge of the RFID tag 40 is 2.5 to 5.45 mm, the spacing L1 between the first surface 1802 of the RFID tag 40 and the top face of the RFID chip 16 as measured along the thickness direction of the substrate 12 is 100 µm, the thickness L2 of the RFID chip 16 as measured along the thickness direction of the substrate 12 is 150 µm, the thickness L3 of the substrate 12 is 400 µm, and the spacing L4 between the antenna plane 44 and the substrate 12 (antenna 14) fronting on the antenna plane 44 as measured along the thickness direction of the substrate 12 is 100 µm.

Since the RFID tag 40 in this embodiment is configured as above, it can be easily produced by use of a mold.

Figure 4:
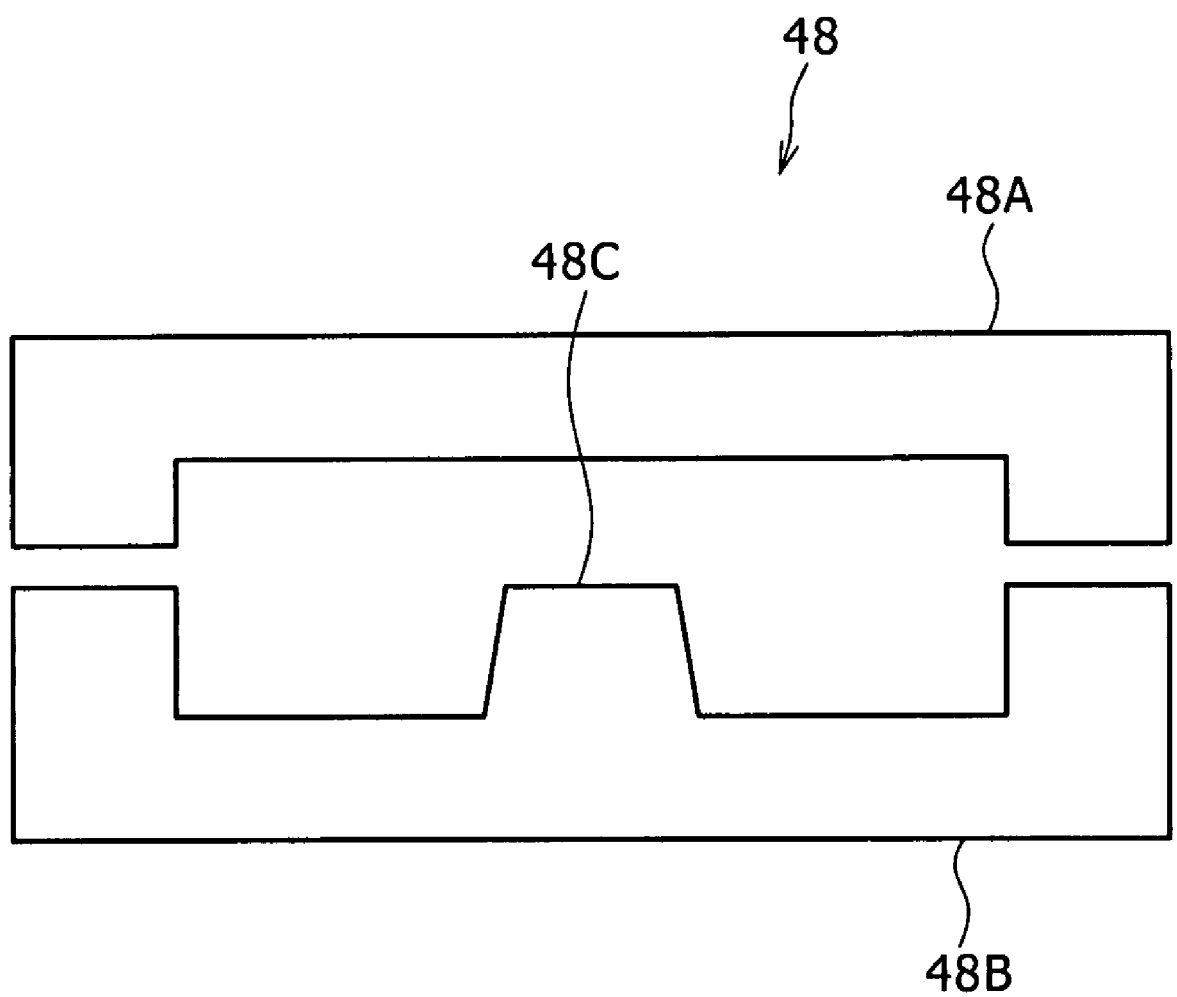
FIG. 4 is an illustration of a mold for molding a package of the RFID tag.

FIG. 4 is a sectional view of a mold 48 for molding the package 18 of the RFID tag 40.

As shown in FIG. 4, the mold 48 includes a first mold 48A for molding the first surface 1802 and the side surfaces near the first surface 1802 of the package 18, and a second mold 48B for molding the second surface 1804, the side surfaces near the second surface 1804 and the recess 46 of the package 18. The second mold 48B is formed with a projected part 48C for molding the recess 46.

Therefore, by mating the first mold 48A and the second mold 48B and, in this condition, charging the cavity formed inside the molds with a molten resin material, it is possible to easily produce the package 18 having the recess 46.

In addition, since the RFID tag 40 in this embodiment is configured as above, it can be easily embedded in a case of a commodity.

Here, the term "a case of a commodity" includes widely the meanings of cases of commodities presently managed by use of bar codes such as, for example, the cases or bodies constituting armors of electronic apparatuses and toys, the main bodies of hangers for clothing, the containers filled with food or drink, etc.

Figure 5A:
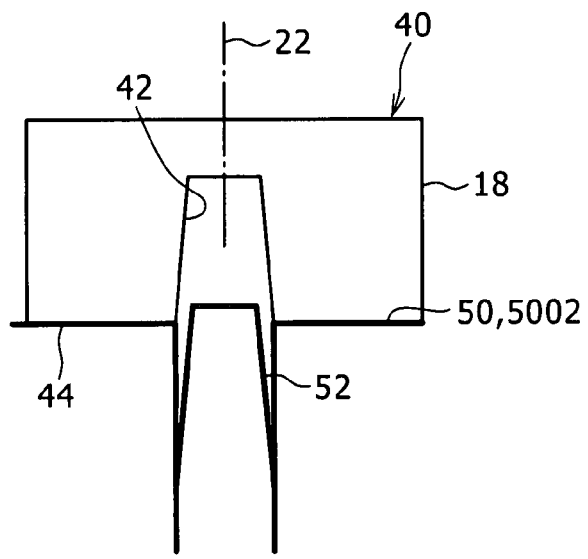
FIGS. 5A, 5B and 5C are illustrations of the case where the RFID tag is embedded.
Figure 5B:
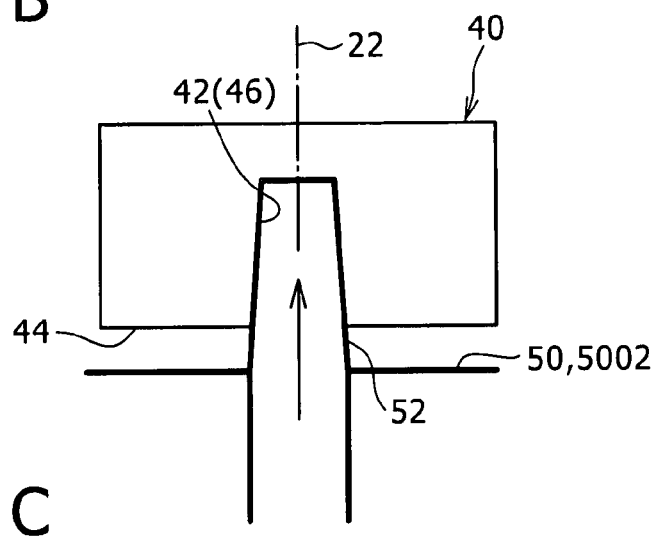
Figure 5C:
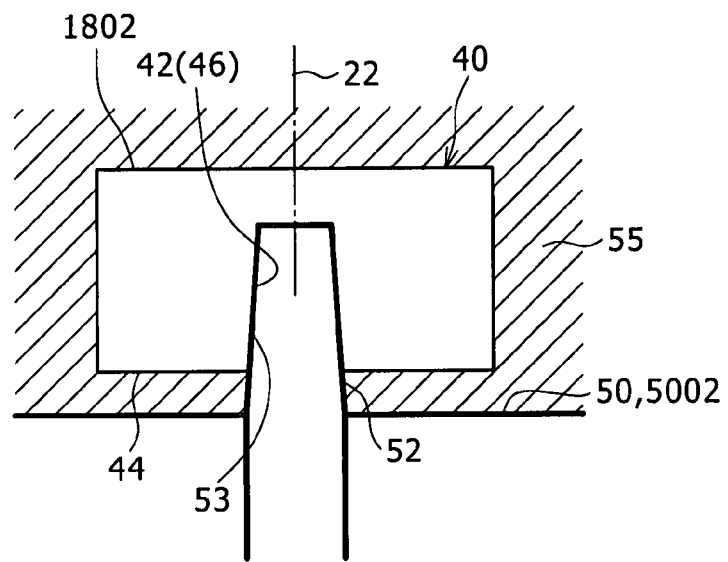

FIGS. 5A, 5B and 5C are illustrations of the case where the RFID tag 40 is embedded.

As shown in FIG. 5A, a positioning pin 52 is provided in a projectable and retractable manner at a cavity surface 5002 of a mold 50 for molding a case of a commodity.

The positioning pin 52 is formed in a shape coinciding with the shape of the mark 42 (recess 46), and the outer peripheral surface of the positioning pin 52 is so formed that the cross section of the positioning pin 52 is gradually decreased in size as the tip of the positioning pin 52 is approached.

Therefore, the positioning of the RFID tag 40 is conducted as follows.

First, as shown in FIG. 5A, in the condition where the positioning pin 52 is retracted from the cavity surface 5002, the RFID tag 40 is mounted with its antenna plane 44 fronting on the cavity surface 5002 so that the mark 42 (recess 46) is located at the tip of the positioning pin 52.

Next, as shown in FIG. 5B, the positioning pin 52 is projected from the cavity surface 5002, whereon the positioning pin 52 is fitted into the mark 42 (recess 46), whereby the positioning pin 52 is positioned and, therefore, the center axis 22 of the antenna 14 and the antenna plane 44 are accurately positioned in relation to the positioning pin 52.

In this condition, as shown in FIG. 5C, the mold 50 is charged with a synthetic resin 55 for molding the case, whereby the RFID tag 40 is integrally molded in the state of being embedded in the case under the condition where the center axis 22 and the antenna plane 44 are accurately positioned.

Therefore, the RFID tag 40 in this embodiment can be easily embedded in the case of a commodity at a desired position and in a desired orientation, so that the antenna plane 44 fronts on the portion of the resin 55 constituting an outside surface of the case. As a result, when the center axis of the antenna 102 of the reader/writer apparatus 100 is matched to a hole 53 formed by drawing out the positioning pin 52, the center axis of the antenna 102 can be set to coincide with, or located in the vicinity of, the center axis 14 of the RFID tag 40, whereby favorable communication can be ensured.

Figure 6:
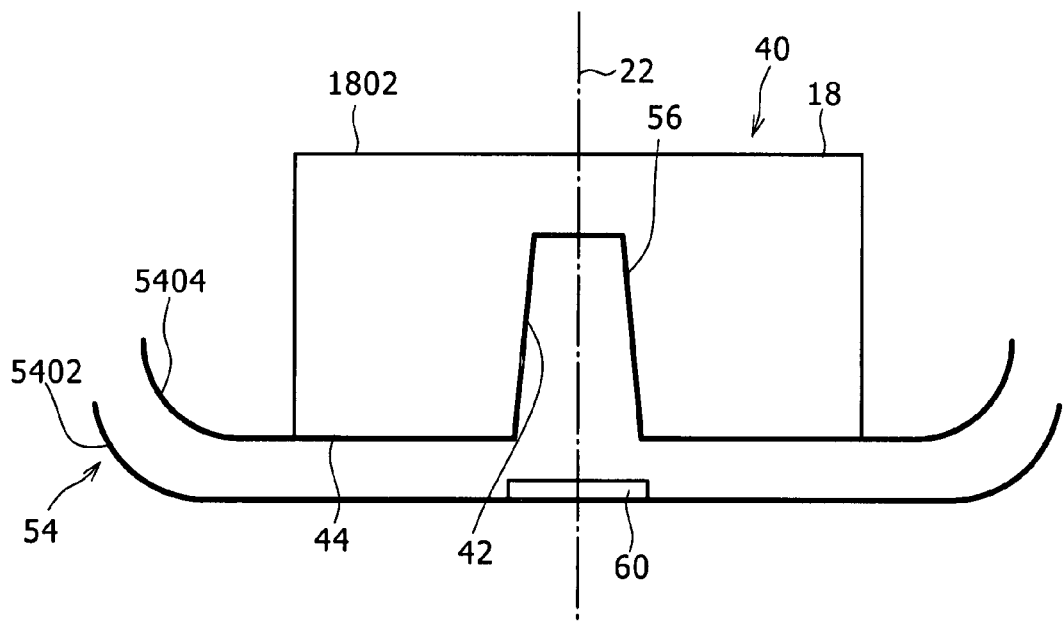
FIG. 6 is an illustration of the case where the RFID tag is attached to the inside surface of a case by use of an adhesive.

FIG. 6 is an illustration of the case where the RFID tag 40 is attached to an inside surface of a case by use of an adhesive.

A case 54 constituting the armor of a commodity has an outside surface 5402 exposed to the outside, and an inside surface 5404 fronting on the inside.

The inside surface 5404 is provided with a positioning projected part 56 projected inwards.

The positioning projected part 56 is formed in a shape coinciding with the shape of the recess 46, and the outer peripheral surface of the positioning projected part 56 is so formed that the cross section of the positioning projected part 56 is gradually decreased in size as the tip of the positioning projected part 56 is approached.

In addition, a mark 60 for identification is provided, by printing, by application of a seal or by marking, on the outside surface 5402 of the case 54 so as to intersect the center axis of the positioning projected part 56.

The positioning and attaching of the RFID tag 40 are conducted as follows.

Preliminarily, either the inner peripheral surfaces of the RFID tag 40 and the antenna plane 44 (second surface 1804) of the RFID tag 40 or the outer peripheral surfaces of the positioning projected part 56 and the inside surface 5404, on which the antenna plane 44 will front, of the case 54, or both of them are coated with an adhesive.

Then, the antenna plane 44 of the RFID tag 40 is made to front on the inside surface 5404 of the case 54, the positioning projected part 56 is inserted into the recess 46, and the antenna plane 44 is brought into contact with the inside surface 5404 of the case 54.

The positioning projected part 56 is positioned by being fitted into the recess 46, so that the center axis 22 of the antenna 14 and the antenna plane 44 are accurately positioned in relation to the positioning projected part 56.

In this condition, the recess 46 and the positioning projected part 56 are adhered and fixed to each other by the adhesive, as a result, the RFID tag 40 is integrally attached to the inside surface 5404 of the case 54 in the condition where the center axis 22 and the antenna plane 44 of the RFID tag 40 are accurately positioned.

Therefore, the RFID tag 40 in this embodiment can be easily embedded in the case of a commodity at a desired position and in a desired orientation, and the antenna plane 44 is directed to the outside surface 5402 of the case 54. As a result, when the antenna 102 of the reader/writer apparatus 100 is matched to the mark 60, the center axis of the antenna 102 can be set to coincide with, or located in the vicinity of, the center axis of the antenna 14 of the RFID tag 40, whereby favorable communication can be ensured.

Figure 7:
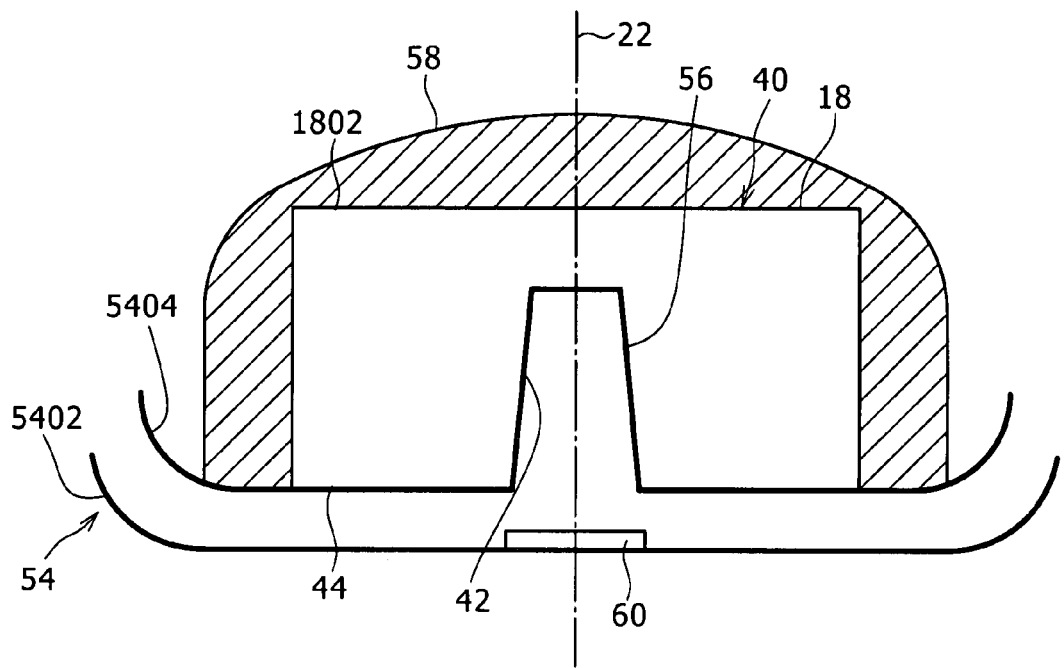
FIG. 7 is an illustration of the case where the RFID tag is attached to the inside surface of a case in a potted state.

Besides, as shown in FIG. 7, the surfaces exclusive of the antenna plane 44, i.e., the side surfaces and the first surface 1802, of the package 18 of the RFID tag 40 attached to the inside surface 5404 of the case 54 may entirely be sealed with a synthetic resin 58. This is more advantageous in securing the durability of the RFID tag 40. As the synthetic resin for sealing, for example, UV-curable resins can be used.

Further, a configuration may be adopted in which the size in the longitudinal direction of the positioning projected part 56 is set to be greater than the size in the depth direction of the recess 46, to thereby form a gap between the inside surface 5404 of the case 54 and the antenna plane 44 of the RFID tag 40, and the synthetic resin 58 is made to enter into the gap. In this case, adhesion between the case 54 and the RFID 40 can be enhanced.

In addition, in this embodiment, the mark 42 is composed of the recess 46, and the recess 46 is so formed that the cross section of the recess 46 is gradually reduced in size as the bottom surface of the recess 46 is approached. Therefore, the following effects are also produced.

Figure 8:
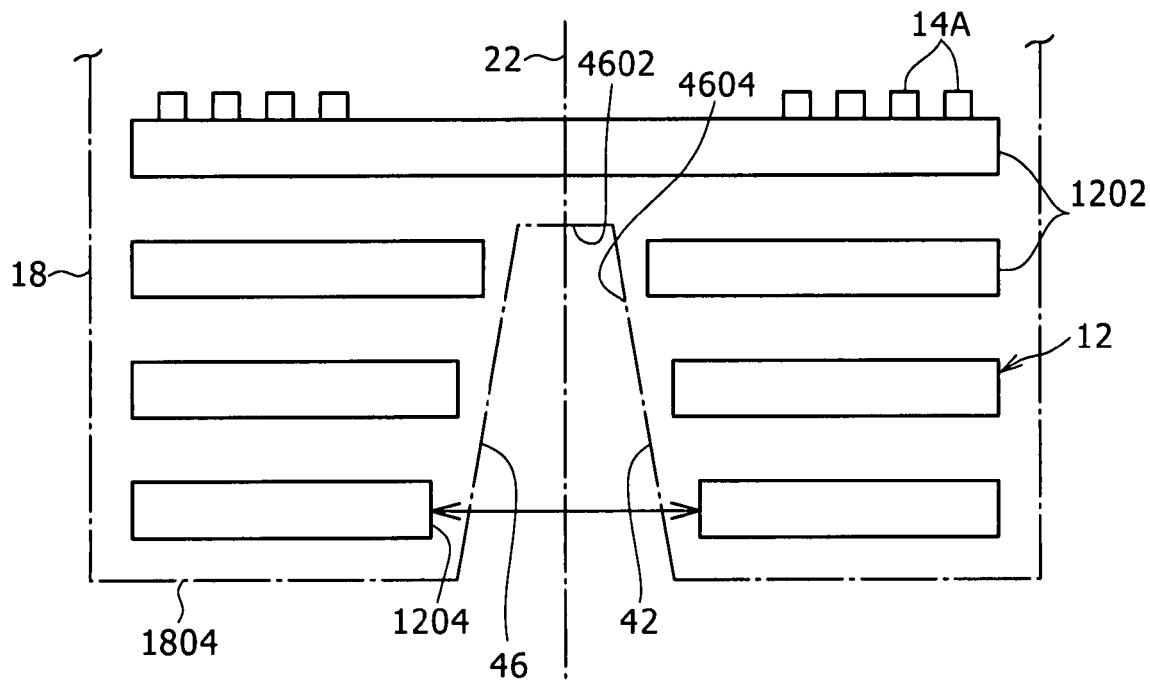
FIG. 8 is a sectional view of the substrate in the first embodiment.

FIG. 8 is a sectional view of the substrate 12.

As shown in FIG. 8, none of the antenna pieces 14A is located in the area in the vicinity of the center axis 22, and each of the insulating layers 12 constituting the substrate 12 is provided, in the area in the vicinity of the center axis 22, with a hole 1204 surrounding the recess 46.

The holes 1204 in the insulating layers 1202 can be so formed that the diameters of the holes 1204 are decreased gradually (stepwise) along the direction from the aperture of the recess 46 toward the bottom surface 4602 of the recess 46, since the cross section of the recess 46 decreases gradually as the bottom surface of the recess 46 is approached.

Therefore, although the recess 46 may be formed with its cross section uniform along the depth direction so that the diameters of the holes 1204 in the insulating layers 1202 are all equal, the above-mentioned configuration makes it possible to enlarge the areas of the insulating layers 1202 (stepwise) as the bottom surface 4602 of the recess 46 is approached. This is advantageous in securing the number of loops (the number of turns) of the antenna pieces 14A and, hence, advantageous for performing favorable communication with the antenna 102.

Incidentally, the maximum traffic distance between the RFID tag 40 and the reader/writer apparatus 100 is basically determined by the antenna area and the number of loops, and the area of the loop center circle can be deemed substantially as an antenna equivalent area. Therefore, when the pattern width and the spacing of the antenna pieces 14A are fixed, the antenna area is determined by the substrate area, and the number of loops is determined by the substrate area and the number of layers in the stack.

Accordingly, in order to elongate the maximum traffic distance, it may be necessary to enlarge the outer size of the package 18 of the RFID tag 40, in other words, to enlarge the projection area of the package 18 in plan view or the size of the package 18 along the thickness direction of the substrate 12.

In this embodiment, however, the number of loops (the number of turns) of the antenna pieces 14A can be secured without increasing the outer size of the package 18 as above-mentioned, which is advantageous in securing a larger maximum traffic distance.

Now, the relationship between the inclination of the antenna 14 of the RFID tag 40 relative to the antenna 102 of the reader/writer apparatus 100 and the maximum traffic distance between the reader/writer apparatus 100 and the RFID tag 40.

Figure 9:
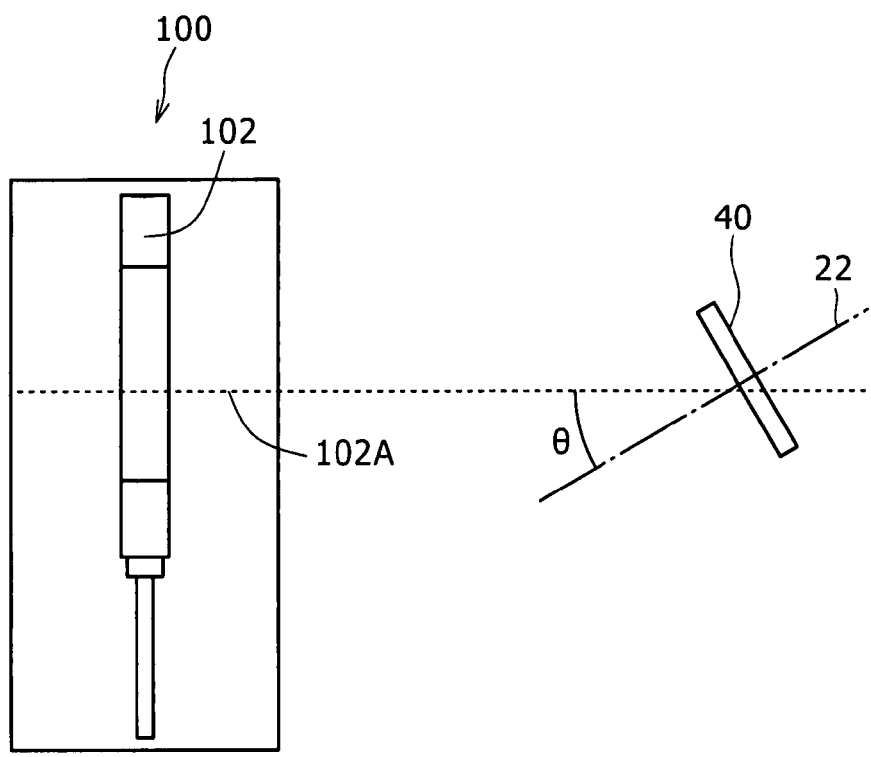
FIG. 9 is an illustration of the case where the center axis of an antenna is inclined by an angle θ in relation to the center axis of an antenna of the reader/writer apparatus.

FIG. 9 is an illustration of the case where the center of the antenna 14 (the expression "the center of the antenna 14" means a central part of the thickness of the laminate of the plurality of antenna pieces 14A on the center axis 22) is located on the center axis 102A of the antenna 102 of the reader/writer apparatus 100 and where the center axis 22 is inclined at an angle θ in relation to the center axis 102A.

Figure 10:
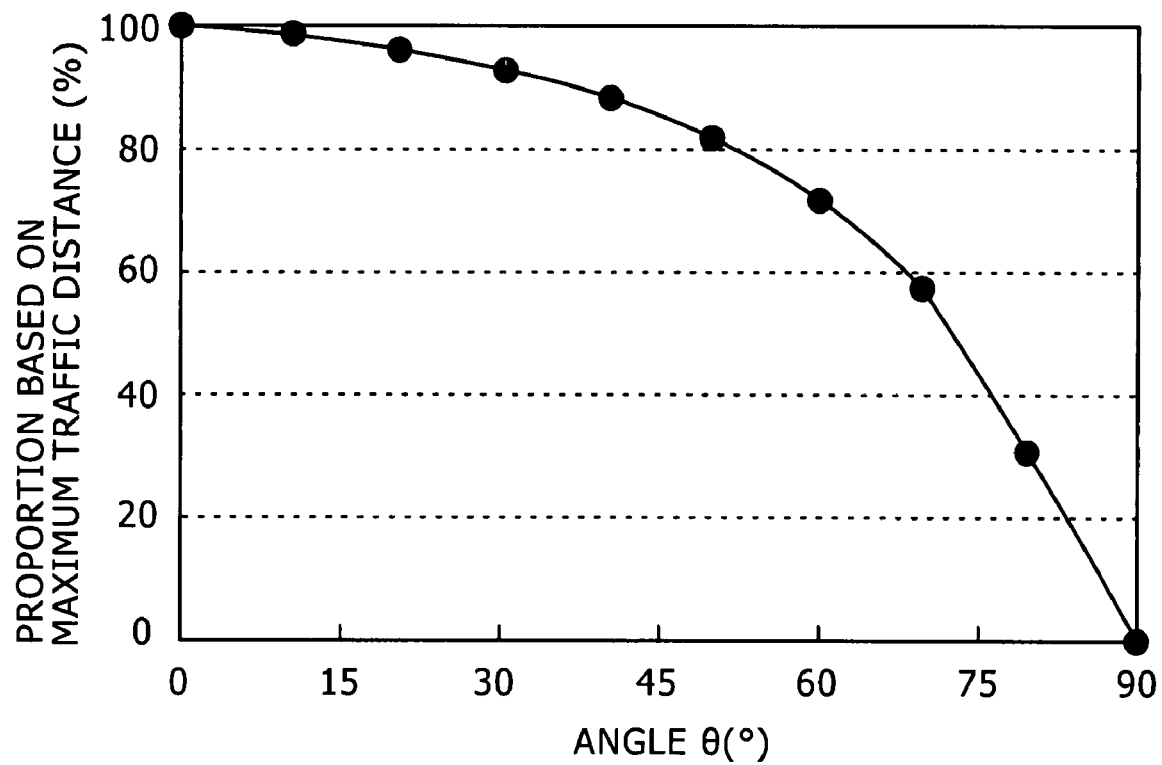
FIG. 10 is a diagram showing the proportion based on the maximum traffic distance in relation to the angle θ, in the case where the maximum traffic distance between the reader/writer apparatus and the RFID tag with the angle θ being 0° is taken as 100%.

FIG. 10 is a diagram showing the proportion based on the maximum traffic distance in relation to the angle θ, in the case where the maximum traffic distance between the reader/writer apparatus 100 and the RFID tag 40 with the angle θ being 0° is taken as 100%.

Incidentally, the antenna 102 of the reader/writer apparatus 100 is formed by winding a conductor in a coil pattern around the center axis 102A, and a plane orthogonal to the center axis 102A is called the antenna plane of the antenna 102.

As shown in FIGS. 9 and 10, the loss of electromagnetic waves transmitted and received between the reader/writer apparatus 100 and the RFID tag 40 can be reduce more as the angle θ is smaller. Therefore, when the RFID tag 40 in this embodiment is used, the RFID tag 40 can be securely embedded or attached with the center axis 22 set in a desired orientation, so that the maximum traffic distance between the reader/writer apparatus 100 and the RFID tag 40 can be secured sufficiently, which is extremely advantageous in performing stable communication.

Incidentally, the setting in which the angle θ between the center axis 102A of the antenna 102 of the reader/writer apparatus 100 and the center axis 22 of the antenna 14 of the RFID tag 40 is set to 0° or set closer to 0° is equivalent to the setting in which the antenna plane of the antenna 102 and the antenna plane 44 of the RFID tag 40 are set parallel to each other or set substantially parallel to each other.

Now, the maximum traffic distance in the case where a metallic body is disposed on the back side of the antenna 14 of the RFID tag 40 will be described below.

Figure 11:
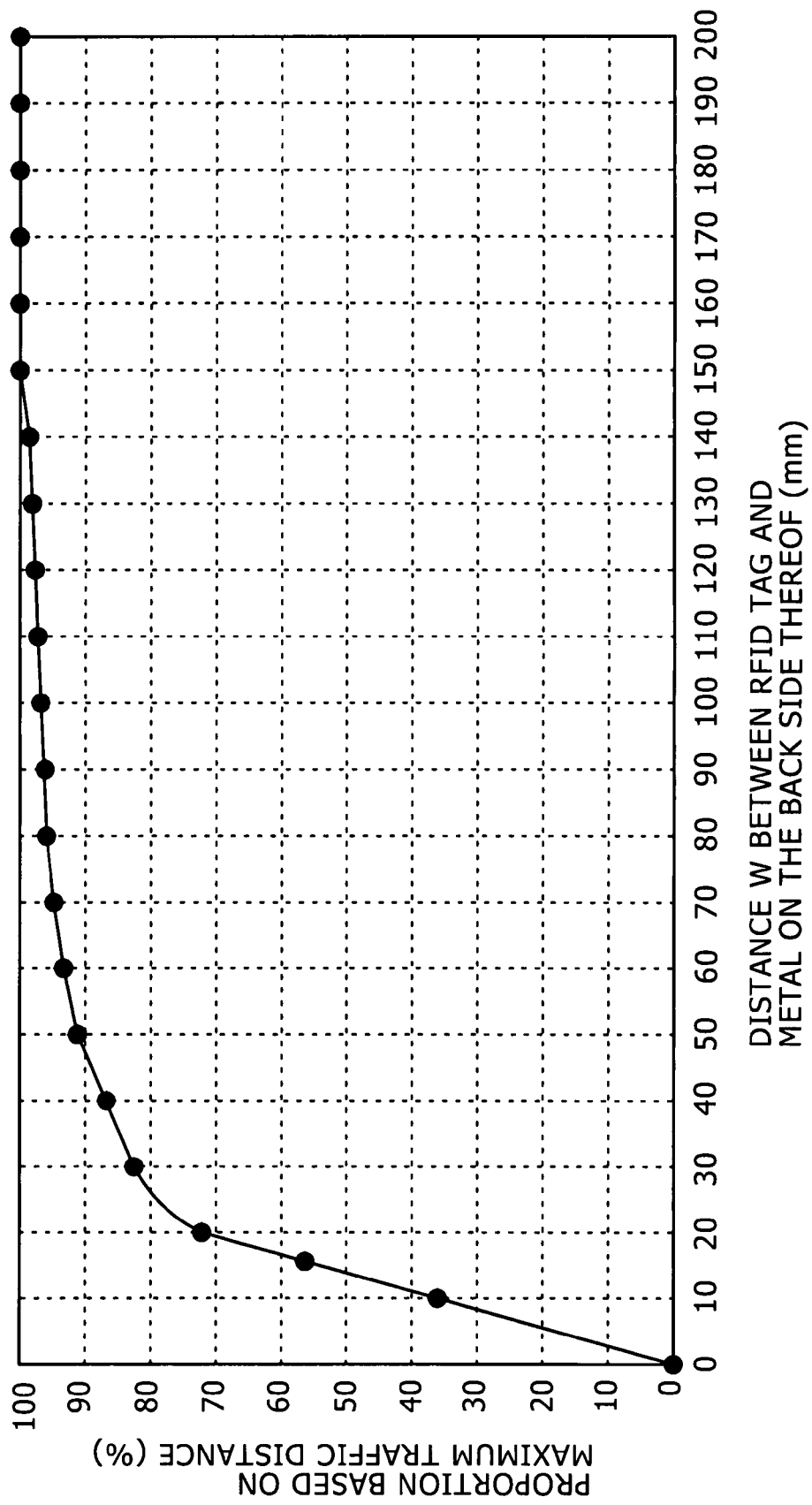
FIG. 11 is a diagram showing the proportion based on the maximum traffic distance in relation to the distance W between the antenna plane of the RFID tag and a metallic body disposed on the back side of the RFID tag, in the case where the maximum traffic distance between the reader/writer apparatus and the RFID tag in the absence of a metallic body on the back side of the RFID tag is taken as 100%.

FIG. 11 is a diagram showing the proportion based on the maximum traffic distance in relation to the distance W between the antenna plane 44 of the RFID tag 40 and a metallic body disposed on the back side of the RFID tag 40, in the case where the maximum traffic distance between the reader/writer apparatus 100 and the RFID tag 40 in the absence of a metallic body (such as a metallic plate and a metal layer) on the back side (the second surface 1802 side) of the RFID tag 40 is taken as 100%.

As shown in FIG. 11, when a metallic body is present in the vicinity of the antenna 14, an eddy current flows in the metallic body due to electromagnetic induction, to disturb transmission and reception, so that the maximum traffic distance is shortened. Therefore, a greater value of the distance W is more advantageous in reducing the disturbance of electromagnetic waves transmitted and received between the reader/writer apparatus 100 and the RFID tag 40.

Accordingly, when the RFID tag 40 in this embodiment is used, the antenna plane 44 can be set in a desired orientation, so that the RFID tag 40 can be disposed while providing a substantial distance between the antenna plane 44 and the metallic body, and, therefore, the maximum traffic distance between the reader/writer apparatus 100 and the RFID tag 40 can be secured, which is extremely advantageous in performing stable communication.

Meanwhile, the cases of electromagnetic apparatuses are frequently provided with a shield metallic body (metal film) extending along the inside surfaces thereof for such a purpose as coping with the problem of electromagnetic radiation. In the case of the RFID tag 40 in this embodiment, however, the distance between the antenna plane 44 and such a metallic body can be securely maximized by setting the antenna plane 44 in a desired orientation, specifically, directing the antenna plane 44 oppositely to the metallic body, and the maximized distance thus secured is extremely advantageous for performing stable communication between the reader/writer apparatus 100 and the RFID tag 40.

Incidentally, in order to suppress the disturbance of transmission and reception due to the presence of a metallic body in the vicinity of an antenna 14, it is often practiced to dispose a high-permittivity low-magnetic-loss sheet between the antenna 14 and the metallic body so as to eliminate the influence of the metallic body. In the case of such a coping with metal, also, not only the position of the center axis 22 of the antenna 14 is important but also it may be necessary to take into account on which side the antenna plane 44 is present and to take such a measure as mounting the members so that the distance between the metallic body and the antenna plane 44 will be as large as possible. According to the RFID tag 40 in this embodiment, such a measure can be easily taken, which naturally is advantageous.

In general, the communication distance of an RFID tag is determined by the frequency band used, the antenna size, the reader output power and the like, and is mainly in the range of several millimeters to several meters. In the cases of the built-in antenna type, as in this embodiment, the antenna size cannot be enlarged substantially, so that the communication distance (maximum traffic distance) in these cases tends to be short. For example, where a feeble-type reader/writer apparatus 100 is used, the communication distance (maximum traffic distance) is 3 to 30 mm.

In addition, the maximum traffic distance as above-mentioned would vary depending on the conditions. This is an example of the communication system at a frequency band of 13.56 MHz. In other systems, also, the relative positions of the RFID tag and the antenna of the reader/writer apparatus is very important, in an off-center relationship, it would be extremely difficult, and might be impossible, to achieve reading of data.

It is possible to broaden the area where data reading is possible, by enlarging the size of the antenna of the reader/writer apparatus 100, but this approach is expensive and is therefore impractical.

On the other hand, the RFID tag 40 in this embodiment ensures that the center axis of the antenna 102 can be made coincide with, or be located in the vicinity of, the center axis 22 of the antenna 14 of the RFID tag 40, which is advantageous in achieving favorable communication while suppressing a rise in the cost of the reader/writer apparatus 100.

Second Embodiment

Now, a second embodiment of the present invention will be described below.

Figure 12A:
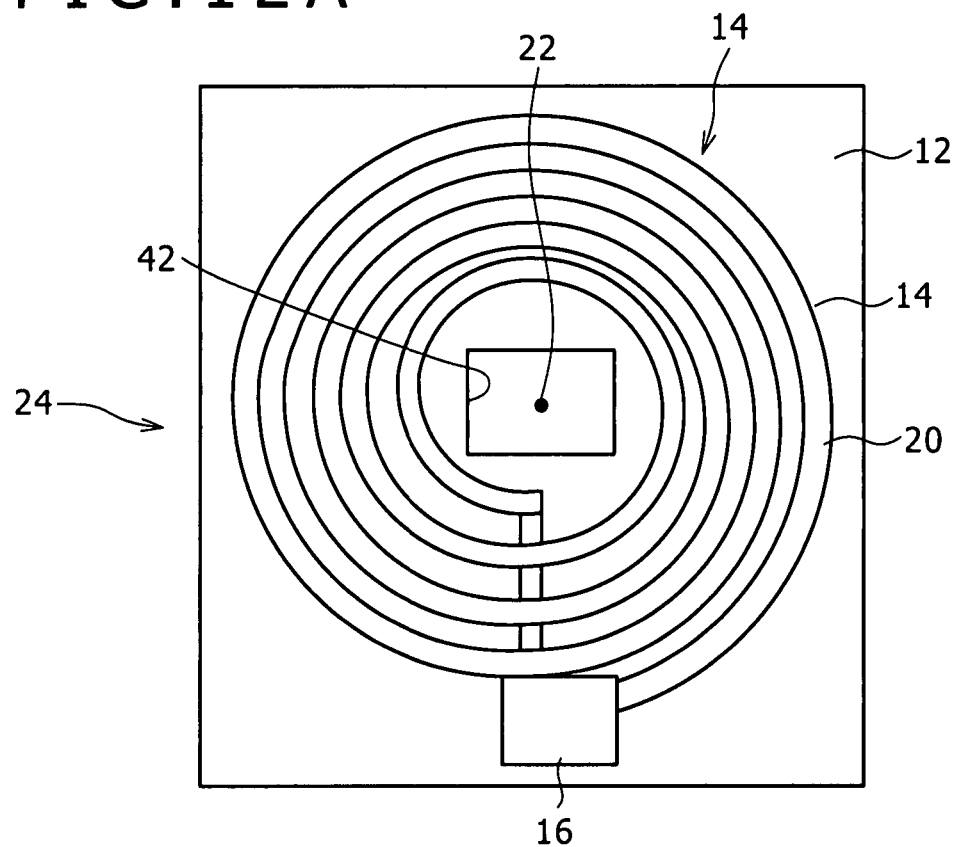
FIG. 12A is a plan view of only a substrate constituting an RFID tag according to a second embodiment.
Figure 12B:
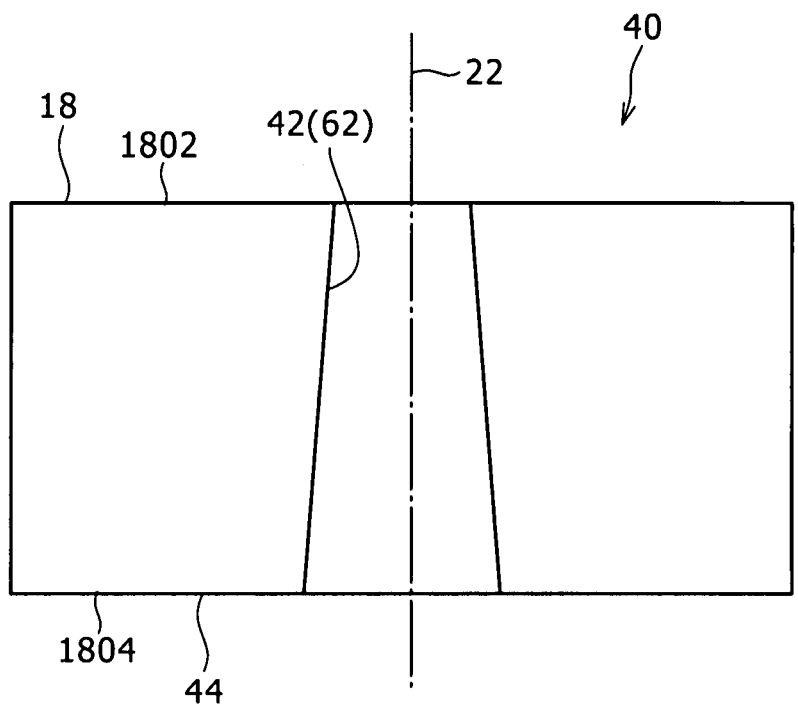
FIG. 12B is a sectional view of the RFID tag with the substrate incorporated therein.

FIG. 12A is a plan view of only a substrate 12 constituting an RFID tag 40 according to the second embodiment, and FIG. 12B is a sectional view of the RFID tag 40 with the substrate 12 incorporated therein.

Like in the first embodiment above, a package 18 has a height along the thickness direction of the substrate 12, and the package 18 includes a first surface 1802 and a second surface 1802 serving as an antenna plane 44, which are located respectively at both ends in the height direction of the package 18.

In the second embodiment, a mark 42 is composed of a hole 62 formed to penetrate from the first surface 1802 to the second surface 1804.

The hole 62 is so formed that its inner diameter gradually decreases along the direction from the antenna plane 44 toward the first surface 1802, and the area where the large diameter part of the hole 62 is located is the antenna plane 44.

In addition, the center axis of the antenna surface 44 and the center axis 22 of an antenna 14 coincide with each other.

Incidentally, in this second embodiment, an RFID chip 16 is located in an area, exclusive of the hole 62, of a surface of the substrate 12.

By the second embodiment thus configured, also, the same effects as those of the first embodiment can be produced.

Besides, in the second embodiment, the hole 62 extends in a penetrating (piercing) manner, so that the hole 62 can be visually checked or confirmed from either of the first surface 1802 and the second surface 1804 of the package 18, which offers the merit that the center axis 22 and the antenna plane 44 can be easily distinguished.

Third Embodiment

Now, a third embodiment of the present invention will be described below.

Figure 13A:
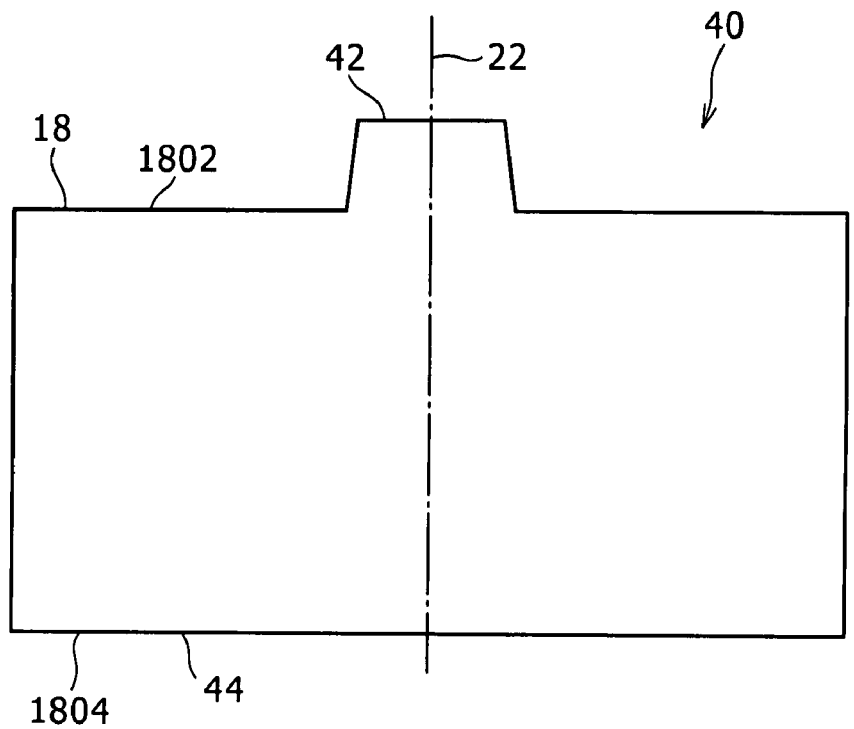
FIGS. 13A and 13B are side views of an RFID tag according to a third embodiment.
Figure 13B:
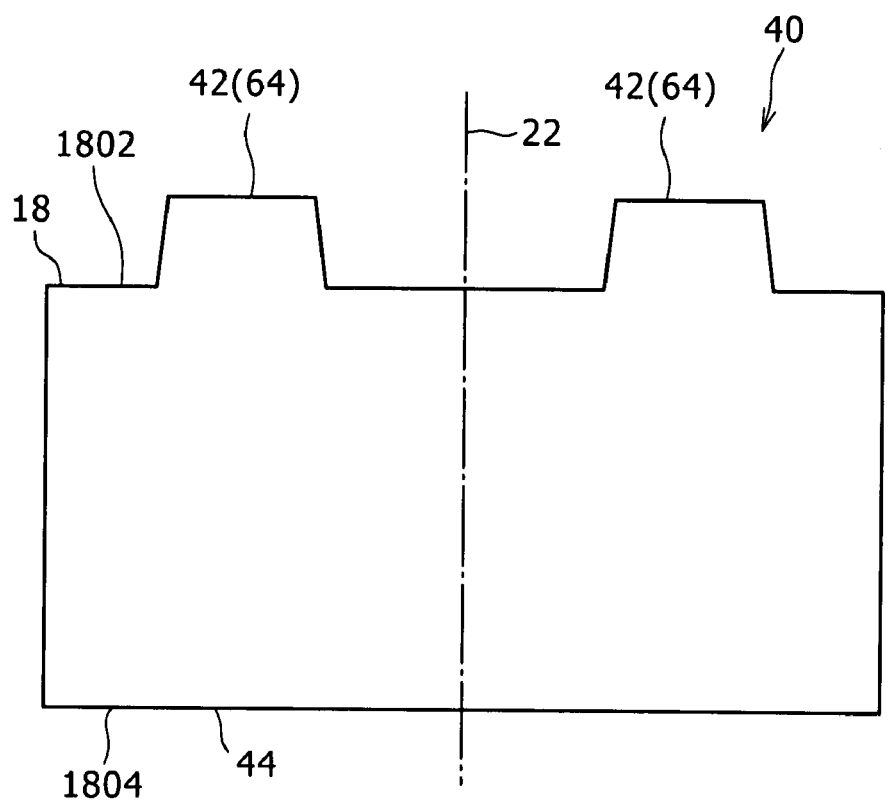

FIGS. 13A and 13B are side views of an RFID tag 40 according to the third embodiment.

In the third embodiment, a mark 42 is provided on a first surface 1802, and the mark 42 is composed of a projected part 64 projected from the first surface 1802.

FIG. 13A shows the case where one projected part 64 is provided, with the center axis of the projected part 64 coinciding with the center axis 22 of an antenna 14.

FIG. 13B shows the case where a plurality of projected parts 64 are provided, with the center of the plurality of projected parts 64 coinciding with the center axis 22 of the antenna 14.

In this embodiment, the mark 42 is provided on the first surface 1802, which is not an antenna plane 44.

Even where the mark 42 is thus composed of the projected part(s) 64, the center axis 22 of the antenna 14 and the antenna plane 44 can be specified, which is advantageous for easily attaching the RFID tag 40 to a commodity.

In addition, where the mark 42 is composed of one projected part 64 or a plurality of projected parts 64, it is unnecessary to provide a substrate 12 with a hole, which is advantageous for cutting the manufacturing cost.

Besides, where the mark 42 is composed of a plurality of projected parts 64, it is ensured that when the package 18 is mounted on a mount surface with the projected parts 64 down, the package 18 can be mounted stably on the mount surface, and the package 18 can advantageously prevented from being inclined.

Fourth Embodiment

Now, a fourth embodiment of the present invention will be described below.

Figure 14:
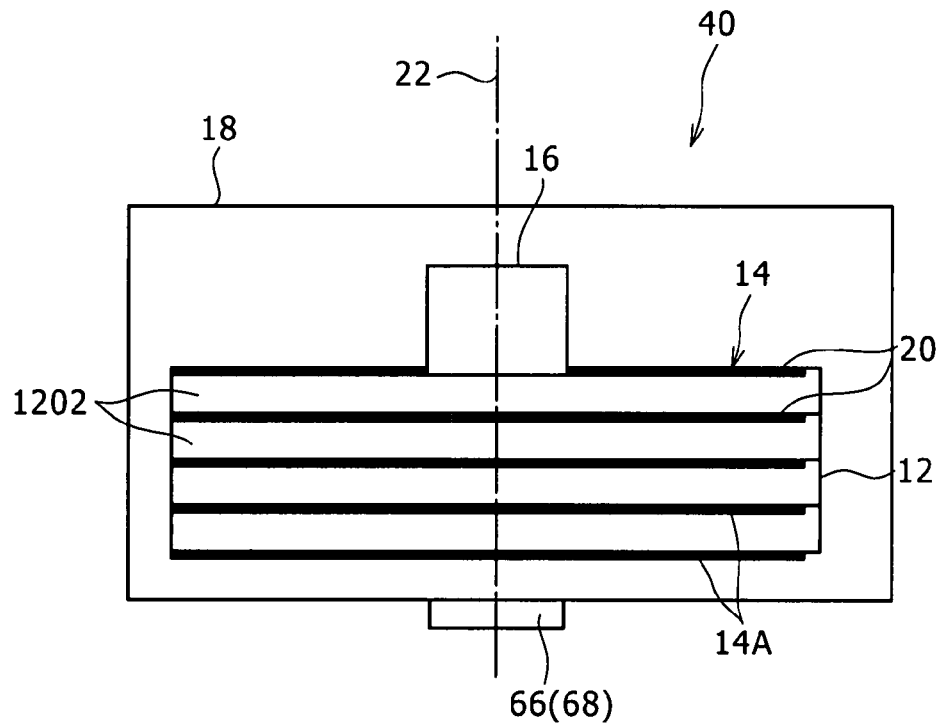
FIG. 14 is a sectional view of an RFID tag according to a fourth embodiment.

FIG. 14 is a sectional view of an RFID tag 40 according to the fourth embodiment.

In the first to third embodiments above, description has been made of the case where the mark 42 is composed of a center axis and antenna plane specifying shape. However, as shown in FIG. 14, the mark 42 may also be a seal 66 applied to an outside surface where the package 18 is exposed to the outside, or may be a printed surface 68 formed on an outside surface where the package 18 is exposed to the outside.

In this case, also, the center axis 22 of an antenna 14 and an antenna plane 44 can be specified by visually recognizing the seal 66 or the printed surface 68, which is advantageous for easily attaching the RFID tag 40 to a commodity.

In addition, where the mark 42 is the seal 66 or the printed surface 68, the seal 66 or the printed surface 68 can be recognized, for example, through image recognition by use of an image processing device, and the center axis 22 of the antenna 14 and the antenna plane 44 can be thereby specified, resulting in that the RFID tag 40 can be assuredly attached to a predetermined portion of the case of a commodity.

Fifth Embodiment

Now, a fifth embodiment of the present invention will be described below.

Figure 15:
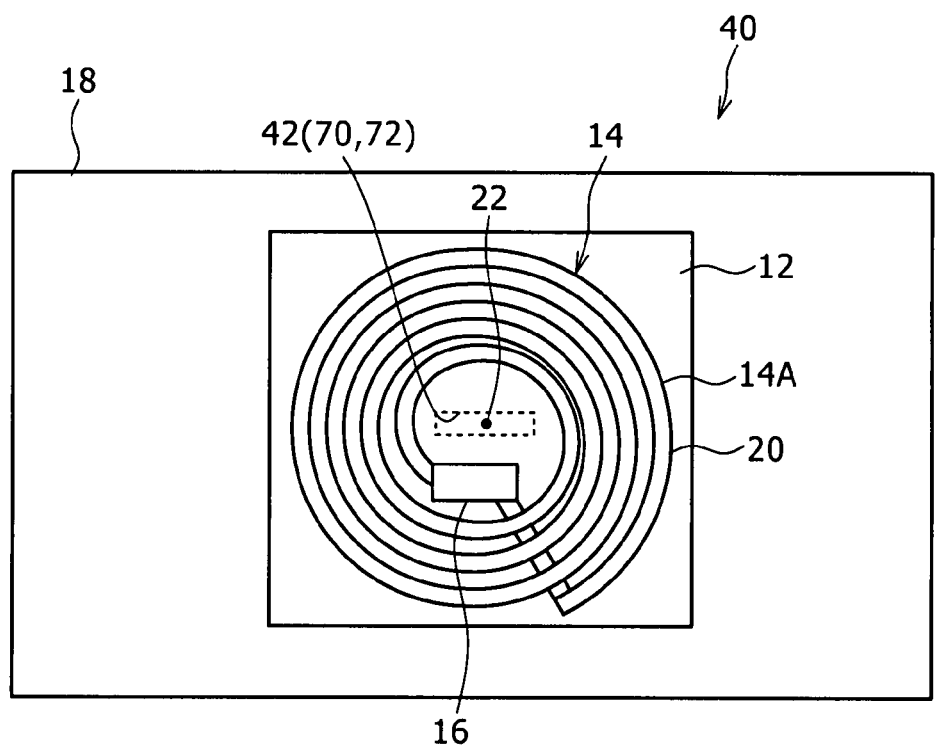
FIG. 15 is a plan view of an RFID tag according to a fifth embodiment.

FIG. 15 is a plan view of an RFID tag 40 according to the fifth embodiment. Incidentally, in FIG. 15, parts to be intrinsically drawn in broken lines are drawn in solid lines, for the purpose of clearly drawing an antenna 14 and an RFID chip 16.

As shown in FIG. 15, a package is elongate in shape, and, in this embodiment, is rectangular in plan view.

A mark 42 in this embodiment is composed of a recess 70 or a projected part 72 in an elongate shape, and is rectangular in plan view.

The longitudinal direction (major sides) of the package 18 and the longitudinal direction (major sides) of the mark 42 are parallel to each other.

According to the fifth embodiment, the effects of the first embodiment naturally are produced. In addition, by a method in which the longitudinal direction of the mark 42 is made to coincide of the direction in which a synthetic resin is fed and flows at the time of molding the case of a commodity, the RFID tag 40 can be smoothly embedded in the case.

Incidentally, in the fifth embodiment, it suffices for the package 18 and the mark 42 to be elongate in shape. Therefore, the shapes of the package 18 and the mark 42 are not limited to rectangles, and may be flat ovals, ellipses or the like.

In addition, in the case where the material constituting a substrate 12 has such a directionality that, for example, the material is more liable to warp in one direction than in a direction orthogonal to the one direction, the mark 42 may be formed in an elongate shape so as to specify the directionality. In that case, the package 18 may not necessarily be in an elongate shape but may be square or circular in plan view.

Incidentally, while the case where the mark 42 is located on the center line 22 has been described in the first to fifth embodiments above, the position where the mark 42 is disposed may be arbitrarily determined, and may be a position deviated from the center axis 22 (a position that is predetermined).

In this case, for example, the mark 42 may be recognized through image recognition by use of an image processing device, and, by specifying the center axis 22 of the antenna 14, the RFID tag 40 can be assuredly attached to a predetermined portion of a case.

Besides, the mark 42 may include a multiplicity of minute projections or minute recesses.

In addition, the position where to provide the mark 42 is not limited to positions on the first surface 1802 and the second surface 1804 but may be on a side surface (peripheral surface) of the package 18.

Incidentally, the case where the mark 42 specifies the center axis 22 and the antenna plane 44 has been described in the first to fifth embodiments, the mark 42 may be used to specify only the center axis 22 of the mark 42, or may be used to specify only the antenna plane 44.

It should be understood by those skilled in the art that various modifications, combinations, sub-combinations and alterations may occur depending on design requirements and other factors insofar as they are within the scope of the appended claims or the equivalents thereof.

What is claimed is:

1. A radio frequency identification tag comprising:
    a substrate;
    an antenna provided at said substrate, said antenna formed by winding a conductor in a coil pattern around, and on a plane orthogonal to, a center axis of said substrate, said center axis extending in a direction parallel to the thickness direction of said substrate;
    a radio frequency identification chip attached to said substrate and operative to perform radio communication with a reader/writer apparatus through said antenna; and
    a package sealing said substrate and said antenna as well as said radio frequency identification chip therein,
    wherein a mark for specifying said center axis is formed on an outside surface where said package is exposed to the outside.

2. The radio frequency identification tag as set forth in claim 1,
    wherein an antenna piece is configured by winding a conductor in a coil form around, and on a plane orthogonal to, said center axis of said substrate, said center axis extending in a direction parallel to the thickness direction of said substrate; and
    said antenna has a plurality of said antenna pieces stacked in the thickness direction of said substrate, with an insulating layer therebetween.

3. The radio frequency identification tag as set forth in claim 1,
    wherein said package has a height along said thickness direction of said substrate;
    said package has a first surface and a second surface located respectively at both ends in the height direction;
    said antenna is located nearer to either one of said first surface and said second surface;
    said one of said first surface and said second surface to which said antenna is located nearer is made to be an antenna plane; and
    said mark for specifying said antenna plane is formed on an outside surface where said package is exposed to the outside.

4. The radio frequency identification tag as set forth in claim 3,
    wherein said radio frequency identification chip is mounted on a surface, fronting on the other one of said first surface and said second surface, of said substrate.

5. The radio frequency identification tag as set forth in claim 1,
    wherein said package has a height along said thickness direction of said substrate;
    said package has a first surface and a second surface located respectively at both ends in the thickness direction; and
    said mark is provided on one of said first surface and said second surface.

6. The radio frequency identification tag as set forth in claim 1,
    wherein an antenna piece is configured by winding a conductor in a coil pattern around, on a plane orthogonal to, and in the surroundings of an area in the vicinity of, a center axis of said substrate, said center axis extending in a direction parallel to the thickness direction of said substrate;
    said antenna has a plurality of said antenna pieces stacked in the thickness direction of said substrate, with an insulating layer therebetween;
    said package has a height along said thickness direction of said substrate;
    said package has a first surface and a second surface located respectively at both ends in said thickness direction;
    said antenna is located nearer to either one of said first surface and said second surface;
    said either one of said first surface and said second surface to which said antenna is located nearer is made to be an antenna plane;
    said mark includes a recess extending along said center axis in an area in the vicinity of said center axis where none of said antenna pieces is located; and
    said recess opens in said antenna plane and has a depth extending along said center axis toward the other one of said first surface and said second surface.

7. The radio frequency identification tag as set forth in claim 6, wherein a bottom surface of said recess is located in an area in the inside of said substrate, and a side surface and said bottom surface of said recess is formed of said package.

8. The radio frequency identification tag as set forth in claim 6, wherein the sectional shape of said recess in a plane orthogonal to the depth direction of said recess is rectangular.

9. The radio frequency identification tag as set forth in claim 6, wherein the sectional shape of said recess in a plane orthogonal to the depth direction of said recess is gradually decreased as said bottom surface of said recess is approached.

10. The radio frequency identification tag as set forth in claim 6, wherein the center of a section of said recess in a plane orthogonal to the depth direction of said recess coincides with said center axis.

11. The radio frequency identification tag as set forth in claim 1,
wherein said mark has a shape integrally formed on an outside surface where said package is exposed to the outside.

12. The radio frequency identification tag as set forth in claim 11,
wherein said shape is formed by a recessed part formed in an outside surface where said package is exposed to the outside.

13. The radio frequency identification tag as set forth in claim 11,
wherein said shape is formed by a projected part formed on an outside surface where said package is exposed to the outside.

14. The radio frequency identification tag as set forth in claim 1,
where said package has a height along the thickness direction of said substrate;
said package has a first surface and a second surface located respectively at both ends in the height direction; and
said mark is formed by a hole formed to penetrate from said first surface to said second surface.

15. The radio frequency identification tag as set forth in claim 1,
wherein said mark is formed by a seal adhered to an outside surface where said package is exposed to the outside.

16. The radio frequency identification tag as set forth in claim 1,
where said mark is formed by a printed surface formed on an outside surface where said package is exposed to the outside.

17. The radio frequency identification tag as set forth in claim 1,
where said mark is provided in an area, located on said center axis, of an outside surface where said package is exposed to the outside.

18. The radio frequency identification tag as set forth in claim 1,
where a plurality of said marks are provided in an area, in the periphery of said center axis, of an outside surface where said package is exposed to the outside, and said center axis is located at the center of said plurality of said marks.

19. The radio frequency identification tag as set forth in claim 1,
where said package is elongate in shape;
said mark is elongate in shape; and
the longitudinal direction of said package and the longitudinal direction of said mark are parallel to each other.

20. A radio frequency identification tag comprising:
a substrate;
an antenna provided at said substrate, said antenna formed by winding a conductor in a coil pattern around, and on a plane orthogonal to, a center axis of said substrate, said center axis extending in a direction parallel to the thickness direction of said substrate;
a radio frequency identification chip attached to said substrate and operative to perform radio communication with a reader/writer apparatus through said antenna; and
a package sealing said substrate and said antenna as well as said radio frequency identification chip therein,
wherein said package has a height along said thickness direction of said substrate;
said package has a first surface and a second surface located respectively at both ends in the height direction thereof;
said antenna is located nearer to either one of said first surface and said second surface;
said either one of said first surface and said second surface to which said antenna is located nearer is made to be an antenna plane; and
a mark for specifying said antenna plane is formed on an outside surface where said package is exposed to the outside.

21. The radio frequency identification tag as set forth in claim 20, wherein said mark is formed on said antenna plane.

22. A commodity having a case provided with a radio frequency identification tag,
said radio frequency identification tag comprising:
a substrate;
an antenna provided at said substrate, said antenna formed by winding a conductor in a coil pattern around, and on a plane orthogonal to, a center axis of said substrate, said center axis extending in a direction parallel to the thickness direction of said substrate;
a radio frequency identification chip attached to said substrate and operative to perform radio communication with a reader/writer apparatus through said antenna; and
a package sealing said substrate and said antenna as well as said radio frequency identification chip therein,
wherein a mark for specifying said center axis is formed on an outside surface where said package is exposed to the outside; and
said radio frequency identification tag is provided in the inside of said case in such a state that its location in the inside of said case and its orientation in the inside of said case are determined with reference to said mark.

23. The commodity as set forth in claim 22,
wherein said package has a height along the thickness direction of said substrate;
said package has a first surface and a second surface located respectively at both ends in the height direction;
said antenna is located nearer to either one of said first surface and said second surface;
said either one of said first surface and said second surface to which said antenna is located nearer is made to be an antenna plane; and
said mark for specifying said antenna plane is formed on an outside surface where said package is exposed to the outside.

24. The commodity as set forth in claim 22,
wherein a mark indicative of the position where said center axis is located is provided on said outside surface of said case.

25. The commodity as set forth in claim 22,
wherein said radio frequency identification tag is embedded in the inside of said case.

26. The commodity as set forth in claim 22,
wherein said radio frequency identification tag is attached to an inside surface of said case.

27. A commodity having a case provided with a radio frequency identification tag,
   said radio frequency identification tag comprising:
   a substrate;
   an antenna provided at said substrate, said antenna formed by winding a conductor in a coil pattern around, and on a plane orthogonal to, a center axis of said substrate, said center axis extending in a direction parallel to the thickness direction of said substrate;
   a radio frequency identification chip attached to said substrate and operative to perform radio communication with a reader/writer apparatus through said antenna; and
   a package sealing said substrate and said antenna as well as said radio frequency identification chip therein,
   wherein said package has a height along the thickness direction of said substrate;
   said package has a first surface and a second surface located respectively at both ends in the height direction;
   said antenna is located nearer to either one of said first surface and said second surface;
   said either one of said first surface and said second surface to which said antenna is located nearer is made to be an antenna plane;
   a mark for specifying said antenna plane is formed on an outside surface where said package is exposed to the outside; and
   said radio frequency identification tag is provided in the inside of said case in such a state that its location in the inside of said case and its orientation in the inside of said case are determined with reference to said mark.

* * * * *